United States Patent [19]

Bailey et al.

[11] Patent Number: 4,788,127

[45] Date of Patent: Nov. 29, 1988

[54] PHOTORESIST COMPOSITION COMPRISING AN INTERPOLYMER OF A SILICON-CONTAINING MONOMER AND AN HYDROXYSTYRENE

[75] Inventors: David B. Bailey, Webster; Michael M. Feldman, Pittsford, both of N.Y.

[73] Assignee: Eastman Kodak Company, Rochester, N.Y.

[21] Appl. No.: 931,495

[22] Filed: Nov. 17, 1986

[51] Int. Cl.$^4$ .................. G03C 1/60; G03C 1/727
[52] U.S. Cl. .................. 430/192; 430/165; 430/166; 430/167; 430/197; 430/270; 430/271; 430/272; 430/312; 430/313; 430/323
[58] Field of Search ............ 430/270, 271, 272, 192, 430/190, 197, 312

[56] References Cited

U.S. PATENT DOCUMENTS

| | | | |
|---|---|---|---|
| 3,869,292 | 3/1975 | Peters | 430/192 |
| 4,481,049 | 11/1984 | Reichmanis et al. | 156/643 |
| 4,521,274 | 6/1985 | Reichmanis et al. | 430/313 |
| 4,551,409 | 11/1985 | Gulla et al. | 430/192 |
| 4,624,909 | 11/1986 | Saotome et al. | 430/190 |
| 4,678,737 | 7/1987 | Schneller et al. | 430/270 |
| 4,689,288 | 8/1987 | Buiguez et al. | 430/270 |

FOREIGN PATENT DOCUMENTS

| | | | |
|---|---|---|---|
| 61-7835 | 1/1986 | Japan | 430/192 |
| 2135793 | 1/1983 | United Kingdom | 430/312 |

OTHER PUBLICATIONS

Reichmanis et al., "Approaches to Resist for Two--Level RIE Pattern Transfer Applications," *Solid State Technology*, Aug. 1985, pp. 130–135.

*Primary Examiner*—Charles L. Bowers, Jr.
*Attorney, Agent, or Firm*—William J. Davis

[57] ABSTRACT

A photoresist composition comprises a photosensitive compound and an interpolymer of a silicon-containing monomer and an hydroxystyrene. The resist composition exhibits superior thermal stability and dissolution rate and good resistance to an oxygen plasma etch.

5 Claims, No Drawings

PHOTORESIST COMPOSITION COMPRISING AN INTERPOLYMER OF A SILICON-CONTAINING MONOMER AND AN HYDROXYSTYRENE

FIELD OF THE INVENTION

This invention relates to radiation-sensitive resists. More particularly, this invention relates to positive and negative-working photoresist compositions containing a photosensitive compound and an interpolymer of a silicon-containing monomer and an hydroxystyrene.

BACKGROUND OF THE INVENTION

Conventional single layer photoresists are unable to perform satisfactorily in the resolution of features smaller than about 1 μm. Typically, a resist is coated at a nominal thickness of 1 to 1.5 μm over a support, which can be a semiconductor substrate (also known as a wafer), having variable topography and reflectivity. As a consequence of such nonuniformity, the combined effect of exposure and development varies from point to point on the wafer. For example, a thin region overlying a highly reflective aluminum support will be overexposed and overdeveloped relative to a thick region overlying a less reflective support. As a result, an intolerable degreee of line and space dimension variation will be evident across the wafer.

Trilevel resists have been utilized in the formation of electronic devices and are especially suitable for resolving features smaller than 1 μm. Such resists can comprise an intermediary layer formed on an underlying planarizing layer, which is generally deposited on the wafer. An overlying third layer, delineable by exposure to radiation and by subsequent treatement with a suitable developing medium, is formed on the intermediary layer. The desired pattern is transferred to the intermediary layer through conventional techniques such as dry or wet etching, causing an uncovering of the underlying layer. The uncovered regions are then removed with an oxygen plasma etch. The intermediary layer, formed from materials such as silicon dioxide, is unaffected by the oxygen plasma, and thus avoids degradation of the transferred pattern. Trilevel resist systems, however, involve many discrete processing steps.

In an attempt to reduce processing steps and associated costs, there has recently been a significant effort to develop a bilevel system yielding the advantages, i.e. planarization and high resolution, of a trilevel system. Attempts have been made to combine the attributes of the intermediary layer and the overlying layer into a single layer which functions as an imaging layer and as an etch mask. In such a case, the layers must be designed to allow the planarizing layer to etch at a rate much faster than the resist layer. Thus, the resist must erode slowly and protect the underlyign planarizing layer as the uncovered planarizing layer is removed. Such attempts have been summarized by Reichmanis et al. in "Approaches to Resists for Two-Level RIE Pattern Transfer Applications," *Solid State Technology,* August 1985, p. 130-135. Many of these attempts involve resists comprising silicon-containing polymers. For example, U.S. Pat. No. 4,481,049 describes a polymer derived from a silicon-containing methyl methacrylate monomer copolymerized with sensitizing oximer or indanone monomers. None of these attempts, however, as yet, are entirely satisfactory. For example, it is desirable to maintain the weight percentage of silicon in such polymers at more than about 6 percent to obtain adequate resistance to the oxygen plasma etch. At such levels of silicon, the prior art polymers exhibit inadequate dimensional stability; i.e. they tend to flow or soften during processing at temperatures greater than 125°C., resulting in image distortion. Moreover, such prior art silicon-containing polymers have poor dissolution rates. Resist dissolution rate is important because it is realted to development time and can affect critical dimension control. Development time is the amount of time necessary for the developer to contact the resist composition to achieve image clean-out. Submicron dimensions of undeveloped composition tend not to retain their tolerances if lengthy development times, for example, greater than about 3 minutes, and/or high base concentration developers are required due to poor dissolution rate. Furthermore, many of the prior art silicon-containing resists are not aqueous-developable. There has been a need, therefore, prior to this invention, to find improved resist compositions which have superior thermal stability at temperatures greater than 125°C., which exhibit excellent dissolution rates and can be developed in an aqueous developer, and which are capable of achieving submicron resolution in a bilevel mode.

SUMMARY OF THE INVENTION

In accordance with this invention, an aqueous-developable photoresist composition is comprised of a positive-working or negative-working photosensitive compound and an interpolymer of a silicon-containing monomer and an hydroxystyrene. The photoresist composition exhibits unexpected advantageous characteristics, including superior thermal stability and dissolution rate, good resistance to an oxygen plasma etch, and the ability to achieve submicron resolution in a bilayer mode.

Other advantageous features will become apparent upon reference to the following detailed description of the preferred embodiments.

DESCRIPTION OF THE PREFERRED EMBODIMENTS

This invention is hereinafter described particuarly with regard to embodiments featuring certain preferred photosensitive compounds and interpolymers, and in a preferred usage, i.e. in a bilevel resist system coated on a support. However, the interpolymer described herein is also useful in single layer resists and in resist compositions featuring any positive-working or negative-working photosensitive compound.

The interpolymers of a silicon-containing monomer and an hydroxystyrene useful herein include copolymers of a silicon-containing monomer and an hydroxystyrene. Furthermore, it is contemplated that one or more additional copolymerizable monomers can be incorporated into the interpolymer, if desired. The term "interpolymer" is intended to include all such polymers, for example, copolymers, terpolymers, tetrapolymers and so forth.

As noted, the photoresist composition of this invention includes any photosensitive compound and an interpolymer of a silicon-containing monomer and an hydroxystyrene. The hydroxystyrene comprises at least one hydroxyl group and preferably is hydroxystyrene or α-methylhydroxystyrene. The hydroxyl group can be in the ortho-, meta- or para-position. Preferably, the hydroxyl group is in the para-position. The phenol nucleus of the hydroxystyrene can be substituted with one or more alkyl or alkoxy groups preferably containing from 1 to 3 carbon atoms.

The silicon-containing monomers useful in the practice of this invention are polymerizable with an hydroxystyrene by solution addition polymerization.

Useful monomers contain ethylenic unsaturation and preferably have the structural formula:

$$\begin{array}{c} CH_2=CR \\ | \\ (L)_n \\ | \\ B \end{array}$$

wherein R is H or CH$_3$, n is 0 or 1, L is a divalent linking group and B represents a silicon-containing moiety. Useful examples of L include ester, amide, sulphonamide, amine, alkylene and arylene linkages. The preferred arylene linkage is phenylene. Short chain alkylene linking groups having 6 carbon stoms or less are preferred. The most preferred alkylene linking groups contain from 1 to 3 carbon atoms. One or more linking groups can be present.

The silicon-containing moiety B can be silyl, alkylsilyl, the alkyl portion of which contains from 1 to 6 carbon atoms such as methylsilyl, ethylsilyl, propylsilyl, dimethylsilyl, trimethylsilyl, and the like, siloxy, alkylsiloxy, such as methylsiloxy, ethylsiloxy, trimethylsiloxy and the like. Trialkylsiloxy substituted silyl groups are particularly useful, primarily due to their high silicon content. Specific exemplary silicon-containing noieties include trimethylsilylmthyl, 2-(trimethylsilyl)ethyl, 3-(trimethylsilyl)propyl, trimethoxysilylmethyl, 2-(trimethoxysilyl)ehtyl, 3-(trimethoxysilyl)propyl, 3-(pentamethyldisiloxy)propyl, 3-[bis(trimethylsiloxy)methylsilyl]propyl, and 3-[tris(trimethylsiloxy)silyl]propyl. The silicon-containing monomer utilized in preparing the interpolymer of this invention preferably is an acrylate, such as a silicon-containing methyl methacrylate monomer. Such silicon-containing monomers are commercially available and/or can be prepared by techniques well known to those skilled in the art. A preferred silicon-containing monomer is 3-methacryloxypropyltris (trimethylsiloxy) silane, available from Petrarch Systems Inc.

A preferred interpolymer comprises recurring units having the structural formulae:

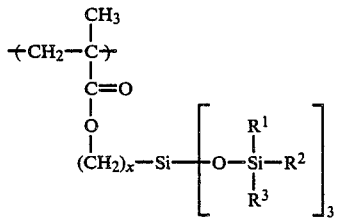 (i)

wherein
x is 1, 2 or 3,
and each R$^1$, R$^2$ and R$^3$ is independently alkyl containing from 1 to 6 carbon atoms, and

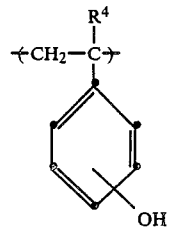 (ii)

wherein R$^4$ is H or CH$_3$.

R$^1$, R$^2$ and R$^3$ in (i) above are independently alkyl, preferably containing from 1 to 6 carbon atoms such as methyl, ethyl, propyl, butyl, pentyl, hexyl and the like. Each R$^1$, R$^2$ and R$^3$ preferably represents methyl. R$^4$ in (ii above preferably represents H.

The interpolymers useful in the practice of this invention are prepared by solution addition polymerixation of a monomer, such as p-trimethylsiloxystyrene, from which the trimethylsilyl group is subsequently removed to form the hydroxystyrene. In general, the interpolymers of this invention cannot be prepared satisfactorily by conventional free radical polymerization techniques. The reason for this is that the phenol functionality of the hydroxystyrene exhibits radical inhibiting properties. Thus, as is illustrated by the Examples which follow, the phenol functionality must be adequately blocked during polymerization. This affords a high degree of control over molecular weight, molecular weight distribution, and composition/performance. Differences in photospeed (thickness loss) of prior art resist compositions, such as those containing novolacs, of as much as 50% are frequently observed due to molecular weight variations in manufacturing runs under the same conditions. Such differences in composition/performance can have a disastrous effect on microelectronic device manufacturing. The interpolymers of this invention, on the other hand, can be prepared with a high degree of uniformity of molecular weight and molecular weight distribution, thus affording a high degree of control over resist composition/performance.

The compositions of this invention comprise an interpolymer preferably having a glass transition temperature of at least 125° C., and most preferably, of at least 150° C. Such interpolymers exhibit good dimensional stability and do not tend to flow or soften during processing at temperatures of 125° C. or more, thus minimizing image distortion. Particularly preferred interpolymers have a molecular weight of about 8,000 when used in positive-working compositions and about 50,000 when used in negative-working compositions.

The compositions of this invention comprise an interpolymer preferably containing at least 6% by weight of silicon. Interpolymers which contain at least 6% by weight of silicon are particularly resistant to an oxygen plasma etch.

Other copolymerizable monomers which are contemplated to be useful when incorporated into the interpolymer include sulfonamides, acrylamides, acrylates such as methyl methacrylate and allyl methacrylate, acrylic acids such as methacrylic acid, chloromethylstyrene, azidostyrenes, hydroxyphenyl maleimides, amine-containing monomers, etc. However, it is preferred that the interpolymer comprise an hydroxystyrene in an amount sufficient to afford aqueous developability to the resist composition. Thus, the hydroxystyrene preferably is present in an amount of at least 30 percent by weight, based on the total weight of the interpolymer. The copolymerizable monomers can be photosensitive as indicated below.

As used herein, a "photosensitive compound" means any compound, be it a polymer or not, which is responsive to activating radiation of any kind to produce a positive or a negative-working image after development of the resist. Thus, it includes those that respond to X-ray or E-beam radiation as well as those that respond to light.

It will be readily apparent that the selection of such photosensitive compound depends upon the activating radiation of choice. Useful non-limiting examples of such photosensitive compounds include diazoketones and quinone diazide compounds and resins, for example, naphthoquinone diazide sulfonated compounds (NDS) or NDS-capped novolac resins or polymers wherein up to 15 mole % of the hydroxyl groups are capped with quinone diazide. Other examples of quinone diazide compounds useful herein are set forth in U.S. Pat. No. 4,141,733, issued Feb. 27, 1979. Additional examples of photosensitive compounds useful herein include o-nitrobenzyl esters and bisazides, such as
2,6-di-(4'-azidobenzal)-4-methylcyclohexanone,
4,4'-diazidodiphenylmethand,
4,4'-diazidodiphenyl,
3,3'-dimethoxy-4,4'-diazidodiphenyl,
4,4'-diazidodiphenylamine,
4,4'-diazidostilbene,
4,4'-diazidobenzalacetophenone,
bis(p-aziudostyryl)ketone, and polycarboxylic acid diazides such as the dicarboxylic acid diazides disclosed in British Patent Specification No. 1,074,234; and the like.

Still other useful photosensitive compounds include poly(methylmethacrylate-co-methacrylic acid) and the homopolymer of methyl methacrylate.

The photoresist composition of the invention can optionally include a variety of conventional addenda, examples of which are readily obtainable from the literature.

The resist composition of the invention is preferably applied to a suitable support and contact or projection-exposed imagewise to activating radiation. As used herein "support" includes semiconductor substrates including, if desired, various levels of, for example, metallization, doped semiconductor material, insulators, and/or planarizing layers. Useful support include sheets and foils of such metals as aluminum, copper, magnesium, zinc, etc.; glass and glass coated with such metals as chromium, chromium alloys, steel, silver, gold, platinum, etc.; synthetic polymeric materials such as poly(alkyl methacrylates), e.g., poly(methyl methacrylate), polyester film base, e.g., poly(ethylene terephthalate), poly(vinyl acetals), polyamides, e.g., nylon, cellulose ester film base, e.g., cellulose nitrate, cellulose acetate, cellulose acetate propionate and cellulose acetatte butyrate. For the manufacture of integrated circuit devices, silicon or silicon dioxide wafers, as well as silicon nitride and chromium-coated glass plate supports, are particularly useful. Depending upon the support selected, adhesion aids are optionally applied first as a sub-coating.

Any conventional method can be used to apply the composition to the support. The preferred method is as a coating using an appropriate solvent. Useful coating techniques include spin-coating, spray coating, cutain coating, and roll coating. The solvent used to prepare the resist composition for coating can be selected from any conventional coating solvent. Useful solvents include alcohols, esters, ethers, and ketones and particularly ethanol, 2-ethoxyethyl acetate, n-butyl acetate, 4-butyrolactone, chlorobenzene, and mixtures thereof.

Preferred final thicknesses of the coatings vary, depending upon the final use. Examples of preferred thicknesses range from between about 0.1 $\mu$ to about 10 $\mu$.

The equipment used to expose the resist is conventional. The compositions described herein are particularly useful in conjunction with exposure sources emitting from 250 nm to 450 nm. The exposure times vary depending on the desired results and equipment used, preferred times being in the range of about 1 m sec. to about 90 sec.

Development of the resist is accomplished by contacting the exposed resist composition with a suitable developer. A particularly advantageous feature of the resist composition is that the interpolymer is sufficiently hydrophilic, even at a high silicon content, to be developable with aqueous developers such as
tetramethylammonium hydroxide,
tetraethylammonium hydroxide,
methyltriethanol ammonium hydroxide,
sodium hydroxide,
ammonium hydroxide,
potassium hydroxide,
sodium carbonate,
sodium silicate,
sodium phosphate, mixtures thereof, and the like.

The aqueous develper can contain lower alcohols, ketones or amines such as the alkylamines, cycloalkylamines, and alkanolamines, as is known in the art. However, development can also be accomplished, if desired, through the use or organic solvents such as hexane, cyclohexane, methylisobutyl ketone, mixtures thereof, and the like. As noted a particularly advantageous feature of the compositions of this invention is their excellent dissolution rate. Thus, these compositions can be developed in conventional developers in less than about 3 minutes and, as indicated by the following examples, often in less than about 2 minutes.

As noted above, the interpolymer described herein is particularly suitable for use in a bilevel resist, however, it is contemplated that the interpolymer can be used as a replacement for novolac and other polymer binders in conventional single layer resists.

In a bilevel mode, the underlying planarizing layer is conventional and not critical. Such layer typically comprises organic materials such as novolac, poly(methyl methacrylate) or polyimide resins. The planarizing layer is formed on the support by methods well known in the art. The planarizing layer can, but, unlike the resist, need not, undergo a chemical change upon exposure to radiation. The planarizing layer must, however, be removable with an oxygen plasma but not appreciably dissolve in the solvent utilized to form the imaging layer. After the overlying resist composition is developed, its pattern is transferred to the planarizing layer. This pattern transfer can be accomplished by subjecting the substrate to a dry etch, such as an oxygen plasma etc, by techniques which are well known. In a preferred embodiment, such dry etch is an oxygen reactive ion etch ($O_2$-RIE). We have found that an $O_2$-RIE provides side walls which are straighter and more uniform than with a conventional wet or plasma development. Reactive ion etching, illustrated by the examples which follow, and dry etching are described by S. J. Jonash in "Advances in Dry Etching Processes—A Review," *Solid State Technology*, Jan. 1985, pages 150–158 and the references cited therein.

EXAMPLES

The following Examples further illustrate the practice of the invention.

Synthesis 1

High Molecular Weight Poly9hydroxystyrene-co-3-methacryloxypropyltris(-trimethylsiloxy)silane) (wt. ratio 64/36) (w/w) (HstSz-64/36)

A mixture of p-trimethylsiloxystyrene (Sst) (7.9g), 3-methacryloxypropyltris(trimethylsiloxy) silane (Sz) (2.1 g), and 2,2'-azobis-(2-methylpropionitrile) (AIBN) initiator (100 mg) was dissolved in toluene (10 g), purged with argon, and sealed in a glass vial. After heating for 16 hours, gas chromatographic (GC) analysis for residual monomers showed the conversion had reached 59%. After precipitation by addition to methanol (200 mL), the soft polymer was kneaded twice with fresh methanol (200 mL) and ground with water (100 mL) in a blender. The yield of white solid was 5.66 g after filtration and air drying. The trimethylsilyl protecting group was removed from the Sst by treating a solution of Sst in THF (5.32 g in 35 mL) with a mixture of 0.1 N HCl (1.4 mL) and THF (1.4 mL). After 30 minutes, the solution was precipitated with water (350 mL), the soft mixture was kneaded with fresh water (350 mL), ground in a blender with water (350 mL) filtered and air dried. To remove the entrapped hexamethyldisiloxane (HMDSi), an acetone solution (18 mL) was precipitated into ligroin 950 (150 mL), the soft polymer was kneaded with fresh ligroin (150 mL), dissolved in acetone (20 mL), precipitated in water (200 mL) in a blender, filtered and air dried. The yield was 2.9g. Composition by H NMR was (w/w) (HstSz-64/36).

Gel permeation chromatography (GPC) showed a $\overline{M}w$ of 50,500 and MWD of 1.87. The glass transition temperature (Tg) by thermal analysis was 155° C.

Synthesis 2

High Molecular Weight HstSz of various compositions

Mixtures of AIBN (100 mg), Sst and Sz in the amounts indicated in Table I were dissolved in toluene (10 g), purged with argon, and sealed in glass vials. After heating for 24 hours, the polymers were precipitated by addition to methanol (250 mL), sheared in a blender with fresh methanol (300 mL), ground with 50/50 methanol/water (300 mL) to yield a hardened filterable solid, redissolved in acetone (20 mL) and precipitated again by the same sequence. The Sst was deblocked to Hst by treating a solution for the polymers in THF (40 mL) with 0.1 N HCl (2 mL) for 30 to 60 min. followed by precipitation into water (400 mL) in a blender and filtration. To remove the entrapped HMDSi, the polymers were dissolved in acetone (50 mL), precipitated with ligroin (500 mL), redissolved in acetone (40 mL), precipitated again with ligroin (400 mL) and allowed to air dry. Finally, the polymers were dissolved in acetone (40 mL), filtered, precipitated with water (400 mL) in a blender, filter and air dried. The compositions by H NMR, molecular weight, Tg, and yield are reported in Table I.

TABLE I

| \multicolumn{4}{c}{Composition Series of HstSz Copolymers} |
|---|---|---|---|
| HstSz (w/w) | Molecular Weight (Mw) | Tg (°C.) | Yield (g) |
| 100/0 | 63,700 | 188 | 3.95 |
| 88/12 | 41,700 | 178 | 4.50 |
| 80/20 | 43,900 | 180 | 4.20 |
| 67/33 | 46,200 | 172 | 4.16 |
| 58/42 | 50,900 | 164 | 3.86 |

Synthesis 3 A

A Low Molecular Weigt HstSz 56/44

A mixture of o-dichlorobenzene, AIBN (0.5 g), Sst (35.3 g) and Sz (14.7 g) was dissolved in THF (30 g), purged with argon, and sealed in a septum capped glass vial. The solution was treated via syringe with 1.8 mole % based on total monomers of t-butyl mercaptan (0.445 mL) chain transfer agent and heated at 60° C. Periodically, aliquots (10 L) were removed, dissolved in toluene (1 mL) and analyzed by gas chromatography for monomer conversion relative to the o-dichlorobenzene internal standard. To compensate for the 3.25 times faster consumption of t-butyl mercaptan relative to monomers, additional t-butyl mercaptan was added incrementally as follows: reaction time (hours)/reaction conversion (%)/t-butyl mercaptan (mL); 4/23/.15; 10.3/44/.175; 22.7/68/.12; 29.6/77/.094; 48/86/0. GPC showed the preisolated crude polymer had a narrow MWD of 1.68 and $\overline{M}w$ of 9,500. A batch polymerization in which all of the chain transfer agent had been added at the beginning of the polymerization had a broad bimodal molecular weight distribtuion. The clear colorless reaction mixture was diluted with THF (to 350 mL) and treated with 0.1 N HCl (20 mL) for 90 min. to remove the trimethylsilyl blocking group. The polymer was precipitated with water (3 L) to form a soft dispersed oil. Ligroin (1 L) was added to extract the THF and HMDS and harden the polymer phase to a filterable coagulum. The soft polymer was ground in a blender with water (600 mL), filtered, dissolved in acetone (125 mL), precipitated with water (1 L) in a blender, filtered and air dried (38.7 g). Subsequently, an acetone solution (150 mL) was filtered, precipitated with ligroin (1 L), redissolved in acetone (100 mL), precipitated and kneaded with fresh ligroin (1 L), ground in a blender with water (600 mL) filtered, and air dried to yield 26.5 g. GC analysis showed no residual Sst, Sz or Hst monomers. A molecular weight ($\overline{M}w$) of 9,300 and MWD of 1.57 were determined by GPC, Tg was 127° C., and composition by H NMR was Hst Sz 56/44.

Synthesis 3 B

Low Molecular Weight Hst Sz 57/43

A repeat of synthesis 3 A was carried out with the following time/conversion/t-butyl mercaptan sequence: 4.3/27/.150; 10.3/52/.26; 22.3/72/.082; 30.5/80/0. The solution was diluted with THF (to 350 mL), treated with 0.1 N HCl (30 mL) for two hours, precipitated (3 L) and kneaded (200 mL) with ligroin, reprecipitated from acetone (150 mL) with ligroin (3 L), and precipitated from acetone (150 mL) with water (3 L). The polymer (26.8 g) was almost identical to 3A with a $\overline{M}w$ of 9,600, MWD of 1.51, Tg of 126° C., and composition by H NMR of 57/43.

Synthesis 3 C

Low Molecular Weight HstSt 56/44

A repeat of Synthesis 3 B at a 1.5X scale was carried out with the following time/conversion/t-butyl mercaptan sequence: 3.5/35/.475; 10.5/59/.196; 22/77/.126; 29/84/.111; 46/91/0. The trimethylsilyl protecting group was removed and the polymer was isolated as in Synthesis 3B. The yield was 41.2 g with an $\overline{M}w$ of 10,000 and a Tg of 125° C.

Synthesis 4

2-Diazo-1-napthol-5-sulfonate (NDS) Derivatized HstSz 56/44

A glass vial was charged with HstSz-56/44 (8 g) prepared as described in synthesis 3 A, 2-diazo-1-napthol-5-sulfonyl chloride (1.26 g) and THF (40 mL), sealed with a rubber septum, purged with argon and cooled in an ice water bath. A 10% w/v solution of triethylamine in THF (5.2 mL) was added over 15 sec. via a syringe and the mixture was allowed to react for 90 min. at 0° C. followed by 2 hours at room temperature. The mixture was treated with acetic acid (0.2 g), added to water to precipitate the polymer which was filtered and air dried. The yield was 8.71 g and contained 13 wt % NDS based on elemental analysis for suflur and nitrogen. The $\overline{M}w$ of 9,600 and MWD of 1.57 determined by GPC were consistent with the parent copolymer.

Synthesis 5

Molecular Weight Series of Hst/Sz 56/44

A mixture, prepared as described in Synthesis 3 A except without the o-dichlorobenzene, was divided into four equal portions, sealed in septum capped glass vials and purged with argon. The solutions were treated with t-butyl mercaptan at the beginning and throughout the course of the polymerization as in synthesis 3 A, but at 0.8, 0.6, 0.4 and 0.2 equivalents. The solutions were diluted with THF (to 100 mL) treated with 0.1 N HCl (7.5 mL) for 60 min, precipitated and kneeded with ligroin (750 mL), dissolved in acetone (100 mL), again precipitated and kneaded with ligroin (750 mL), dissolved in acetone (100 mL), precipitated with water (600 mL) and air dried. The data is listed in Table II.

TABLE II

HstSz-56/44 Molecular Weight Series

| Equivalents t-Butyl Mercaptan | Mw | Tg (°C.) |
|---|---|---|
| 0.8 | 12,900 | 135 |
| 0.6 | 15,700 | 138 |
| 0.4 | 19,000 | 141 |
| 0.2 | 27,400 | 146 |

Synthesis 6 A

High Molecular Weight HstSz 55/45

A mixture of Sst (35.3 g), Sz (14.7 g), AIBN (0.5), and o-dichlorobenzene (2.0 g) was dissolved in toluene (50 g), purged with argon, and sealed in a glass vial with a rubber septum. After heating for 48 hours, GC analysis for residual monomers showed the conversion had reached 88%. After precipitation by addition to methanol (1.1 L) in a blender, the soft polymer was sheared twice with fresh methanol (500 mL) followed by 50/50 water/methanol (500 mL), filtered, dissolved in THF (250 mL) and treated with 0.1 N HCl (15 mL) for 60 min. The polymer was precipitated with water (3 L), ground with water (500 mL) in a blender, filtered, twice dissolved in acetone (125 mL) and precipitated (1.2 L) and kneaded (1.2 L) with ligroin dissolved in acetone (125 mL), filtered and precipitated with water (1 L) to yield 20.3 g after air drying. H NMR revealed a trace of residual HMDSi so the final sequence of acetone-ligroin-acetone-water precipitation was repeated. The final yield was 19.2 g of HstSz 55/45 by H NMR, with a Tg of 152° C., $\overline{M}w$ of 47,100 and MWD of 1.71.

Snythesis 6B

High Molecular Weight HstSz 55/45

The 6A synthesis was repeated in four separate vials. After 48 hours and an 88% conversion, the combined solutions were precipitated (5 L) and sheared (1.5 L) twich with methanol followed by 50/50 methanol/water (1.5 L) in blender. The yield after filtration and air drying was 165 g (82.5%). The polymer was dissolved in THF (1 L), treated with 0.1 N HCl (60 mL) for 1 hour, precipitated (12 L) and sheared (1.5 L) with water in a blender, isolated, dissolved in acetone (to 700 mL), filtered precipitated with water (3 L), filtered and air dried for 3 days. Rather than carry out the lengthy series of ligroin precipitations to remove entrapped MHDS, the polymer was dried at reduced pressure (24" Hg) under a nitrogen bleed at 50° C. in a vacuum oven. The sample weight decreased by 3.1% which H NMR showed accounted for almost all of the HMDSi. The bake did not adversely affect polymer properties as dissolution rate in Kodak Micro Positive Developer 934 (tetramethylammonium hydroxide) diluted 1:1.75 with water, was 9.4 and 10.2 mµ/sec. before and after bake and essentially the same as 9.9 /sec. for the synthesis 6A polymer. The $\overline{M}w$ of 42,300 and MWD of 1.72 by GPC were the same as the prebake values. The composition was 56/44 by H NMR and Tg was 149° C.

EXAMPLE 1

O₂-RIE Resistance of HstSz Copolymers

The $O_2$-RIE resistance of the series of copolymers described in Synthesis 2 was measured using a PLASMATRAC-2406 instrument manufactured by Plasma Systems Inc. The conditions were 33° C. electrode temperature, 150 watts supplied to the 6" electrode in an oyxgen atmosphere maintained at 20 millitorr at a flow rate of 30 scc/min. Spin coatings of 0.8 µ thickness were made from diglyme on 3" silicon wafers and prebaked at 90° C. for 30 min. Each coating was etched sequentially for 1, 2, 2 and 2 min. and the thickness measured after each etch period. The etch data summarized in Table III shows that 8.8% silicon gives an over 7 fold increase in etch selectivity relative to hydroxystyrene homopolymer.

TABLE III

Etch Resistance of HstSz Copolymers

| HstSz(w/w) | Si(wt %) | Etch Rate (mµ/min) | Relative Etch Resistance |
|---|---|---|---|
| 100/0 | 0 | 270 | 1.0 |
| 88/12 | 3.2 | 217 | 1.2 |
| 80/20 | 5.3 | 167 | 1.6 |
| 67/33 | 8.8 | 36 | 7.5 |
| 58/42 | 11.2 | 10 | 27.0 |

EXAMPLE 2

Positive Image of HstSz-57/43 with NDS

A diglyme solution (20.0 g) of the polymers described in synthesis 3B (1.72 g) and synthesis 4 (2.0 g), phloroglucinol tir-2-diazo-1-napthol-5-sulfonate (Tris), (0.28 g) and a surfactant solution of 10% FC-170 Surfactant, available from the 3M Company, in 90% ethyl 3-ethoxypropionate (8.2 mg) was divided into two 10 g portions, of which one was treated with polychlorbenxotriazole (PCBT) (0.082 g). Therefore, both solutions contained a total of 0.51 meq/g of NDS, half bound to the polymer and half in the form of Tris; one solution also contained 0.2 meq/g of PCBT. The solutions were spin coated on 3" silicon wafers containing a 811.5 silicon dioxide layer and prebaked in a convection oven at 90° C. for 30 min. to give a thickness of 330 to 370 m$\mu$. The wafers were exposed in two steps for 20 and 30 sec. in a contact mode through a positive mask (Toppan test chart P-CP358) containing line and space geometries down to 0.5 $\mu$m. The exposure tool was an Oriel model 8160 equipped with a 200 watt broad band mercury lamp with an outlet of 6 mw/cm$^2$ from 365 to 436 nm. The images were developed for 30, 45, 60, and 90 sec. with Kodak Micro Positive Developer 934 diluted 1:1 with water. Optical micrographs of the images showed lines could be resolved down to 1 and line and space dimensions were nearly equal when development was pushed to 90 sec. Thickness loss also increased with development time, from 14% at 30, 45, and 60 sec. to 29% at 90 sec.

EXAMPLE 3

Negative Imaging of Low Molecular Weight HstSz-57/43 with Bisazide

A coating solution consisting of 2,6-di-(4'-azidobenzal)-4-methylcyclohexanone (DABMc) (0.4 g) and HstSz-57/43 (synthesis 3B) (1.6 g) in cyclohexanone (8 g) was spin coated on silicon wafers and baked at 90° C. for 30 min. to give a film thickness of 527.4 m$\mu$. The wafer was exposed in three steps for 10, 20 and 30 sec. in a contact mode as in Example 2. The images were developed for 120 sec. in Kodak Micro Positive Developer 934 diluted 5:3 with water. Optical micrographs showed cleaned out images with equal 0.9 $\mu$m lines and spaces at 20 sec. exposure.

EXAMPLE 4

Negative Imaging of Low Molecular Weight HstSz-56/44 with Bisazide

Two cyclohexanone coating solutions consisting of DABMc and HstSz-56/44 (Synthesis 3C) mistures in the ratios of 20/80 and 15/85 w/w were spin coated at 15 wt % solids on silicon wafers and baked at 90° C. for 30 min. to give coatings of 380 to 400 m$\mu$. The wafers were exposed in four steps for 10, 20, 25 and 30 sec. in a contact mode as in Example 3, but through a negative mask (4"×4" Z7PD-10-DF tone, photorepeater final on glass, Phototronics Labs Inc.). The images were developed as in Example 3 but for 120 and 150 sec. for the 15/85 composition; 150 and 180 sec. for the 20/80 composition. Scanning electron microscopy of the images in the 0.8$\mu$ geometry region showed scum free images with nearly equal lines and spaces for the 15/85 at 25 sec. exposure and 150 sec. development and at 20 sec. exposure, 150 sec. development for the 20/80 composition. Thickness loss was less than 10%.

EXAMPLE 5

Contrast and Speed of HstSz-56/44 with Bisazide

The molecular weight series of copolymers described in synthesis 5 were formulated with DABMc at 85/15 w/w in cyclohexanone at 10 to 13 wt %, spin coated and baked at 90° C. for 30 min. to give 390 to 410 m$\mu$coatings. The films were exposed in 12 steps form 0.5 to 64 sec. (0.5 to 147 mj/cm) with an Optical Association Model 780 equipped with a 310 dichroic mirror and 400 watt lamp. A Kodak 18A filter was used to limit the radiation to the 365 nm band which had an output of 2.4 mw/cm$^2$. The films were developed in Kodak Micro Positive Developer 934 at the indicated concentration and time to reach the desired gel doses. Speed and contrast were derived from plots of normalized thickness remaining vs. exposure dose in the standard fashion described by G. N. Taylor (*Solid State Tech.*, 105, June, 1984). The speed and contrast improved markedly with molecular weight and longer development as summarized in Table IV.

TABLE IV

Sensitometry of Molecular Weight Series of HstSz-56/44 Copolymers

| Molec. Weight | Gel Dose of 3-4 mj/cm$^2$ | | | Gel Dose of 7-8 mj/cm$^2$ | | |
|---|---|---|---|---|---|---|
| | Dev.[a] | Speed (mj/cm$^2$) | Contr. | Dev.[a] | Speed (mj/cm$^2$) | Contr. |
| 10,000 | 87/3:1 | 46 | 0.9 | 56/3:1 | 93 | 0.9 |
| 12,900 | 64/7:1 | 42 | 0.9 | 88/3:1 | 49 | 1.1 |
| 19,000 | 77/7:1 | 28 | 1.1 | 123/3:1 | 38 | 1.4 |
| 27,400 | 120/7:1 | 18 | 1.5 | 172/3:1 | 22 | 2.4 |
| 47,100 | 110/1:0 | 7 | 3.6 | 174/1:0 | 14 | 4.4 |

[a]Development time (sec.)/dilution of Kodak Micro Positive Developer 934 with water

EXAMPLE 6

Negative Imaging of Single Layer Resist

A cyclohexanone coating solution at 10% w/w solids consisting of DABMc and HstSz-58/42 (synthesis 2) mixtures in the ratio of 15/85 w/w was spin coated on a silicon wafer and baked at 90° C. for 30 min. to give a coating of 381.9 m$\mu$. The wafer was exposed in threee steps for 2, 3 and 4 sec. in a contact mode as in Example 5 through a negative mask (Example 4). The images were developed in Kodak Micro Positive Developer 934 for 80, 110 and 170 sec. A combination of 3 sec. exposure and 170 sec. development gave equal 0.8 $\mu$m lines and spaces as measured by scanning electron microscopy.

EXAMPLE 7

Negative Imaging of Bilevel Resist

Kodak Micropositive Resist ZX-826 was diluted 6:1 with ethoxyethyl acetate/butyrolactone (9:1), coated on four inch silicon wafers containing 490 to 500 m$\mu$ of silicon dioxide, and baked at 270° C. for 90 sec. on a Eaton LSI-60 hot plate/cold plate track to give a 1200 to 1300 planarizing layer. The layer was overcoated with a 10% w/w cyclohexanone solution of HstSz-55/45 and DABMc (85/15 w/w) and baked in a convection oven at 90° C. for 30 min. to give 340 to 350 m$\mu$ imaging layer. The wafer was exposed on a 405 Censor stepper in 5 mj/cm$^2$ increments from 10 to 65 mj/cm$^2$. The images were developed in Kodak Mircopositive Developer 934 for 120, 150, 180 and 240 sec. Scanning electron microscopy of the images showed equal lines and spaces at 0.8 and 1.2 could be achieved at 40 mj/cm² and 180 sec. development. The optimum image was subjected to O₂-RIE as described in Example 1 at 10 millitorr, 150 watts, 12 scc/min. for 277 sec. After RIE, the bilayer thickness had decreased form 1656.9 to 1585.6 μm but did not break through the silicon layer. The etch gave vertical side walls and maintained the 1.2 μm and 0.8 μm geometries, but left all exposed surfaces with a grass like material.

The invention has been described in detail with particular reference to preferred embodiments thereof, but it will be understood that variations and modifications can be effected within the spirit and scope of the invention.

What is claimed is:

1. A positive-working photoresist composition comprising in admixture a photosensitive o-quinone diazide compound which is responsive to activating radiation to provide a postive resist image after development and a film forming interpolymer having a glass transition temperature of at least 125° C.; said interpolymer being an interpolymer of an hydroxystyrene and a silicon-containing monomer and wherein said interpolymer comprises recurring units having the structural formulae:

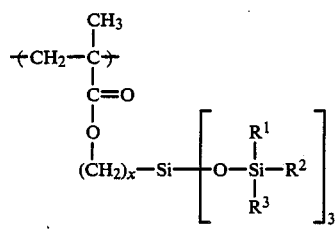
(i)

wherein
x is 1, 2 or 3,
and each $R^1$, $R^2$ and $R^3$ is independently alkyl containing from 1 to 6 carbon atoms, and

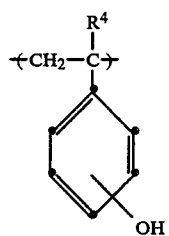
(ii)

wherein $R^4$ is H or $CH_3$, said hydroxystyrene being present in said interpolymer in an amount sufficient to render said composition developable in an aqueous alkaline developer and said silicon containing monomer being present in said interpolymer in an amount sufficient to render said photoresist composition resistant to an oxygen plasma etch.

2. A negative-working photoresist composition comprising in admixture a photosensitive bisazide compound which is responsive to activating radiation to provide a negative resist image after development and a film forming interpolymer having a glass transition temperature of at least 125° C.; said interpolymer being an interpolymer of an hydroxystyrene and a silicon-containing monomer and wherein said interpolymer comprises recurring units having the structural formulae:

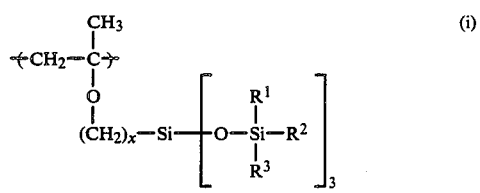
(i)

wherein
x is 1, 2 or 3,
and each $R^1$, $R^2$ and $R^3$ is independently alkyl containing from 1 to 6 carbon atoms, and

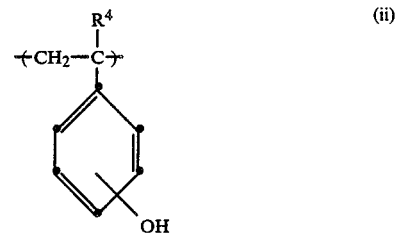
(ii)

wherein $R^4$ is H or $CH_3$, said hydroxystyrene being present in said interpolymer in an amount sufficient to render said composition developable in an aqueous alkaline developer and said silicon containing monomer being present in said interpolymer in an amount sufficient to render said photoresist composition resistant to an oxygen plasma etch.

3. The composition of claim 1 wherein said interpolymer comprises at least 6% by weight of Si.

4. The composition of claim 1 wherein $R^4$ is H.

5. The composition of claim 1 wherein $R^1$, $R^2$ and $R^3$ are methyl.

* * * * *